(12) United States Patent
Payne et al.

(10) Patent No.: US 9,441,154 B2
(45) Date of Patent: Sep. 13, 2016

(54) BARIUM IODIDE AND STRONTIUM IODIDE CRYSTALS AND SCINTILLATORS IMPLEMENTING THE SAME

(71) Applicants: Lawrence Livermore National Security, LLC, Livermore, CA (US); FISK UNIVERSITY, Nashville, TN (US)

(72) Inventors: Stephen A. Payne, Castro Valley, CA (US); Nerine Cherepy, Piedmont, CA (US); Christian Pedrini, Villeurbanne (FR); Arnold Burger, Nashville, TN (US)

(73) Assignees: Lawrence Livermore National Security, LLC, Livermore, CA (US); Fisk University, Nashville, TN (US)

( * ) Notice: Subject to any disclaimer, the term of this patent is extended or adjusted under 35 U.S.C. 154(b) by 92 days.

(21) Appl. No.: 14/220,904

(22) Filed: Mar. 20, 2014

(65) Prior Publication Data
US 2014/0361221 A1   Dec. 11, 2014

Related U.S. Application Data

(63) Continuation-in-part of application No. 14/047,893, filed on Oct. 7, 2013, which is a continuation of application No. 12/255,375, filed on Oct. 21, 2008, now Pat. No. 8,580,149.

(60) Provisional application No. 60/988,475, filed on Nov. 16, 2007.

(51) Int. Cl.
| C09K 11/08 | (2006.01) |
| C09K 11/77 | (2006.01) |
| C30B 11/00 | (2006.01) |
| C30B 29/12 | (2006.01) |

(52) U.S. Cl.
CPC ........ *C09K 11/7772* (2013.01); *C09K 11/7733* (2013.01); *C30B 11/00* (2013.01); *C30B 29/12* (2013.01)

(58) Field of Classification Search
CPC .......... C09K 11/7733; C09K 11/7772; C09K 11/7705; C09K 11/00883; C09K 11/7791; C30B 11/00; C30B 29/12; G21K 4/00; G21K 2004/06; G01T 1/202; G01T 1/2023
USPC ...................... 252/301.4 H, 301.4 R, 301.17; 250/370.11; 423/497
See application file for complete search history.

(56) References Cited

U.S. PATENT DOCUMENTS

| 3,163,610 A | 12/1964 | Yocom |
| 3,373,279 A | 3/1968 | Hofstadter |
| 3,480,552 A * | 11/1969 | Fisher .................... 252/62.51 R |
| 3,667,921 A * | 6/1972 | Grodkiewicz et al. ................. 252/301.4 R |
| 4,030,965 A | 6/1977 | Hammond et al. |
| 4,048,501 A | 9/1977 | Grenier |
| 4,100,101 A | 7/1978 | Messier et al. |
| 4,587,555 A | 5/1986 | Carollo et al. |
| 4,607,164 A | 8/1986 | Kubota et al. |
| 4,839,853 A | 6/1989 | Deerwester et al. |
| 4,999,515 A | 3/1991 | Nakamura et al. |
| 5,422,220 A | 6/1995 | Leblans et al. |
| 5,500,147 A | 3/1996 | Fitzpatrick |
| 5,723,865 A | 3/1998 | Trissel et al. |
| 7,279,120 B2 | 10/2007 | Cheng et al. |
| 7,547,888 B2 | 6/2009 | Cooke et al. |
| 7,625,502 B2 | 12/2009 | Clothier et al. |
| 7,655,157 B2 | 2/2010 | Cheng et al. |
| 8,431,041 B2 | 4/2013 | Osinski et al. |
| 8,486,300 B2 | 7/2013 | Gundiah et al. |
| 8,580,149 B2 | 11/2013 | Payne et al. |
| 8,884,233 B2 | 11/2014 | Cherepy et al. |
| 2004/0007676 A1* | 1/2004 | Iwabuchi ................. G21K 4/00 250/484.4 |
| 2007/0170396 A1 | 7/2007 | Appleby et al. |
| 2010/0001209 A1* | 1/2010 | Osinski ................ C09K 11/664 250/459.1 |
| 2010/0034351 A1* | 2/2010 | Yanagita .............. A61B 6/4216 378/62 |
| 2010/0044576 A1 | 2/2010 | Payne et al. |

(Continued)

FOREIGN PATENT DOCUMENTS

| EP | 1754808 A1 * | 2/2007 | |
| EP | 2133449 A1 * | 12/2009 | .......... C01F 17/0056 |

(Continued)

OTHER PUBLICATIONS

Kaczmarek et al., "Optical and EPR study of BaY2F8 single crystals doped with Yb", available online May 8, 2009, Journal of Luminescence, vol. 129, pp. 1568-1574.*

(Continued)

*Primary Examiner* — Matthew E Hoban
*Assistant Examiner* — Lynne Edmondson
(74) *Attorney, Agent, or Firm* — Zilka-Kotab PC

(57) ABSTRACT

In one embodiment, a crystal includes at least one metal halide; and an activator dopant comprising ytterbium. In another general embodiment, a scintillator optic includes: at least one metal halide doped with a plurality of activators, the plurality of activators comprising: a first activator comprising europium, and a second activator comprising ytterbium. In yet another general embodiment, a method for manufacturing a crystal suitable for use in a scintillator includes mixing one or more salts with a source of at least one dopant activator comprising ytterbium; heating the mixture above a melting point of the salt(s); and cooling the heated mixture to a temperature below the melting point of the salts. Additional materials, systems, and methods are presented.

17 Claims, 12 Drawing Sheets

(56) References Cited

U.S. PATENT DOCUMENTS

| | | |
|---|---|---|
| 2010/0200741 A1 | 8/2010 | Dotzler et al. |
| 2010/0268074 A1 | 10/2010 | Van Loef et al. |
| 2011/0165422 A1* | 7/2011 | Gundiah et al. ............. 428/402 |
| 2012/0193539 A1 | 8/2012 | Bizarri et al. |

FOREIGN PATENT DOCUMENTS

| | | | |
|---|---|---|---|
| JP | 04126791 A | 4/1992 | |
| WO | 2013/041251 A2 | 3/2013 | |
| WO | WO 2013041251 A2 * | 3/2013 | ........... C09K 11/772 |

OTHER PUBLICATIONS

Bigotta et al.,"Laser cooling of Yb3+-doped BaY2F8 single crystal", 2006, Optical Materials, 28, pp. 1321-1324.*
Mehta et al., "EPR Identification of coupled Yb3+ ion pairs in optically bistable compound CsCdBr3:Yb", 2001, Journal of Alloys and Compounds, 323-324, pp. 308-311.*
"Common Cations, Anions, Acids, Salts and Hydrate Nomenclature" by Missouri University of Science and Technology webpage (http://web.mst.edu/~tbone/subjects/tbone/chem1/chem%201%20compound%20sheet%20fs08.pdf), printed Feb. 17, 2016, 2 pages.*
Advisory Action from U.S. Appl. No. 14/047,893, dated Apr. 17, 2015.
Advisory Action from U.S. Appl. No. 14/047,893, dated Feb. 20, 2015.
Barnighausen et al., "Die Kristallstruktur der monoklinen Form von Europium(II)-jodid EuJ2," Acta Cryst., 1969, pp. 1104-1110.
Bessiere et al., "Luminescence and scintillation properties of the small band gap compound LaI3:Ce3+," 2004 Elsevier BV., Nuclear Instruments and Methods in Physics Research A, vol. 537, 2005, pp. 22-26.
Brackett et al., "The Crystal Structures of Barium Choride, Barium Bromide, and Barium Iodide," Journal of American Chemical Society, vol. 67, Oct. 1963, pp. 2132-2135.
"Bridgman-Stockbarger technique," http://enwikipedia.org/wiki/Bridgman-StockbargeUechnique, Aug. 12, 2008, 1 page.
Cherepy et al., "Barium iodide single-crystal scintillator detectors," SPIE-Hard X-Ray and Gamma-Ray Detector in Physics IX, Aug. 2007, pp. 1-7.
Costanzo, D.A., "Determination of Europium (II) and Total Europium in Europium-Activated Lithium Iodide Scintillation Crystals," Analytical Chemistry, vol. 36, No. 10, Sep. 1964, pp. 2042-2044.
Final Office Action from U.S. Appl. No. 12/255,375, dated Mar. 13, 2013.
Final Office Action from U.S. Appl. No. 14/047,893, dated Nov. 6, 2014.
Glodo et al., "Scintillation properties of LuI3:Ce," 2004 Elsevier BV., Proceedings of the 7th International Conference on Inorganic Scintillators and their Use in Scientific and Industrial Applications, vol. 537, Issue 1-2, Jan. 21, 2005, pp. 279-281, abstract only.
Goryushkin et al., "A thermographic study of gadolinium iodide," Russian journal of Inorganic Chemistry, vol. 37, No. 9, 1992, pp. 994-995.
Hawrami et al., "SrI2, a Novel Scintillator Crystal for Nuclear Isotope Identifiiers," SPIE, vol. 7079, 2008, pp. 70790Y/1-70790Y/11.
Hofstadter et al., "CaI2 and CaI2(Eu) Scintillation Crystals," IEEE Transactions on Nuclear Science, Jun. 1964, pp. 12-14.
https://ahdictionary.com/word/search.html?q=several (definition of several), printed Oct. 30, 2014.
Lehmann, W., "Heterogeneous Halide-Silica Phosphors," Journal of Electrochemistry Social, vol. 122, Issue 6, Jun. 1975, 1 page.
Moses et al., "Potential for RbGd2Br7:Ce, LaBr3:Ce, LaBr3:Ce, and LuI3:Ce in nuclear medical imaging," 2004 Elsevier B.V., Nuclear Instruments and Methods in Physics Research A, vol. 537, 2005, pp. 317-320.
http://www.newworldencyclopedia.org/entry/Europium, (entry for Europium), printed Jul. 2012.
Non-Final Office Action from U.S. Appl. No. 12/255,375, dated Aug. 1, 2012.
Non-Final Office Action from U.S. Appl. No. 12/255,375, dated Feb. 13, 2012.
Non-Final Office Action from U.S. Appl. No. 12/255,375, dated Oct. 4, 2011.
Non-Final Office Action from U.S. Appl. No. 14/047,893, dated Dec. 19, 2013.
Non-Final Office Action from U.S. Appl. No. 14/047,893, dated Jun. 2, 2014.
Notice of Allowance from U.S. Appl. No. 12/255,375, dated Jul. 16, 2013.
Novosad, S., "Scintillation characteristics of thin-film calcium iodide crystal x-ray detectors," Technical Physics, vol. 43, No. 8, Aug. 1998, 1 page.
Selling et al., "Cerium-doped barium halide scintillators for x-ray and y-ray detections," Journal of Applied Physics, vol. 102, 2007, pp. 074915/1-074915/7.
Selling et al., "Europium-doped barium halide scintillators for x-ray and y-ray detections," Journal of Applied Physics, vol. 101, 2007, pp. 034901/1-034901/5.
http://www.thefreedictionary.com/scintillator, (definition of scintillator), printed Jul. 2013.
Woody, C., "Radiation Damage in Cesium Iodide and Other Scintillating Crystals," Brookhaven National Laboratory, 1992, pp. 1-10.
Payne et al., U.S. Appl. No. 12/255,375, filed Oct. 21, 2008.
Payne et al., U.S. Appl. No. 14/047,893, filed Oct. 7, 2013.
Antonini et al., "Properties of Yb:YAG scintillators," 2002 Elsevier Science B.V., Nuclear Instruments and Methods in Physics Research A, vol. 486, 2002, pp. 220-227.
Antonini et al., "Scintillation properties of Yb-doped yttrium-aluminum garnets," 2002 Elsevier Science B.V., Nuclear Instruments and Methods in Physics Research A, vol. 488, 2002, pp. 591-603.
Belogurov et al., "Properties of Yb-doped scintillators: YAG, YAP, LuAG," 2003 Elsevier B.V., Nuclear Instruments and Methods in Physics Research A, vol. 516, 2004, pp. 58-67.
Chipaux et al., "Ytterbium-based Compounds as Fast and Dense Inorganic Scintillators," 2002 IEEE, pp. 966-970.
Fukabori et al., "Growth of Yb-doped Y2O3, Sc2O3, and Lu2O3 single crystals by the micro-pulling-down technique and their optical by scintillation characterization," 2012 Elsevier B.V., Journal of Crystal Growth, vol. 352, 2012, pp. 124-128.
Gu et al., "Theoretical Calculations on Rare Earth Elements in Barium Fluoride Crystal," Chinese Physical Letter, vol. 12, No. 2, 1995, pp. 76-78.
Kaczmarek et al., "Optical and EPR study of BaY2F8 single crystals doped with Yb," 2009 Elsievier B.V., Journal of Luminescence, vol. 129, 2009, pp. 1568-1574.
Zadneprovski et al., "New inorganic scintillators on the basis of LBO glass for neutron registration," 2005 Institute for Single Crystals, Functional Materials, vol. 12, No. 2, 2005, pp. 261-268.
Zeng et al., "Effects of gamma-irradiation and air annealing on Yb-doped Y3Al5O12 single crystal," 2007 Elsevier B.V., Spectrochimica Acta Part A, vol. 69, 2008, pp. 860-864.
Zeng et al., "Effects of gamma irradiation and air annealing on Yb-doped YAlO3 single crystals," 2005 Wiley-VCH Verlag GmbH & Co., Physica Status Solidi A, vol. 202, No. 6, pp. 1129-1134.
Xia et al., "Irradiation Damage on BaLiF3 Crystallites and its Suppression by Rare-Earth Ion Doping," The Electromchemical Society, Inc., Journal of Electrochemical Society, vol. 144, No. 10, Oct. 1997, pp. 3640-3644.
Zadneprovskii et al., "Fast radiation-resistant Bi4GeO12:Yb single-crystal scintillators," 1992 American Isntitute of Physics, Soviet Technical Phsyical Letters, vol. 18, No. 5, May 1992, pp. 296-297.
Wojtowicz et al., "Cerium-Doped Orthophosphate Scintillators," 1994 Materials Research Society, Material Research Society Symposium Proceedings, vol. 348, pp. 123-129.

(56) References Cited

OTHER PUBLICATIONS

Huang et al., "Color Centers and Charge Transfer Luminescence in a Yb3+-Doped PbWO4 Single Crystal," Journal of the Korean Phsyical Society, vol. 49, No. 1, Jul. 2006, pp. 227-232.
Rowe et al., "A New Lanthanide Activator for Iodide Based Scintillators: Yb2+," IEEE Transactions on Nuclear Science, vol. 60, No. 2, Apr. 2013, pp. 1057-1060.
Boatner et al., "Bridgman growth of large SrI2:Eu2+ single crystals: A high-performance scintillator for radiation detection applications," Journal of Crystal Growth, vol. 379, 2013, pp. 63-68.
Gundiah et al., "Scintillation Properties of Eu2+-Activated Barium Fluoroiodide," IEEE Transactions on Nuclear Science, vol. 57, No. 3, Jun. 2010, pp. 1702-1705.
Nicollin et al., "Experimental Contribution to the study of S-state ions in ionic single crystals," Journal of Physics, C: Solid State Physics, vol. 11, 1978, pp. 4803-4814.
Radzhabov et al., "Photoionization processes in barium fluorohalide crystals doped with Eu2+," Journal of Physics: Condensed Matter, vol. 13, 2001, pp. 1159-1169.
Bizarri et al., "Scintillation and Optical Properties of BaBrI:Eu2+ and CsBa2I5:Eu2+," IEEE Transactions on Nuclear Science, vol. 58, No. 6, Dec. 2011, pp. 3403-3410.
Dorenbos, P., "Anomalous luminescence of Eu2+ and Yb2+ in inorganic compounds," Journal of Physics: Condensed Matter, vol. 15, 2003, pp. 2645-2665.
Birowosuto et al, "Ce3+ activated LaBr3-xLx: High-light-yield and fast-response mixed halide scintillators," Journal of Applied Physics, vol. 103, 2008, 103517/1-103517/6.
Blasse et al., "Luminescent Materials," Springer-Verlag, 1994, pp. 1-242.
Bourret-Courchesne et al, "BaBrI:Eu2+, a new bright scintillator," Nuclear Instruments and Methods in Physics Research A, 2010, pp. 95-97.
Bourret-Courchesne et al, "Eu2+-doped Ba2CsI5, A New High-Performance Scintillator," Nuclear Instruments and Methods in Physics Research A, vol. 612, vol. 1, 2009, pp. 138-142.
Boutchko et al, "Cerium Activated Scintillation in Yttrium Halides: First Principles Theory and Prediction," IEEE Transactions on Nuclear Science, vol. 56, No. 3, 2009, pp. 977-981.
Cherepy et al., "Scintillators with potential to supersede lanthanum bromide," IEEE Transactions on Nuclear Science, vol. 56, No. 3, Jun. 2009, pp. 873-880.
Cherepy et al., "Strontium and barium iodide high light yield scintillators," Applied Physics Letters, vol. 92, No. 8, 2008, pp. 1-3.
Derenzo et al, "Design and Implementation of a Facility for Discovering New Scintillator Materials", IEEE Transactions on Nuclear Science, vol. 55, No. 3, 2008, pp. 1458-1463.
Derenzo et al, "The quest for ideal inorganic scintillator", Nuclear Instruments and Methods in Physics Research A, vol. 505, 2003, pp. 111-117.
Gan, "Chapter 9: Laser Crystals," Laser Materials, 1995, pp. 194-208.
Gundiah et al., "Europium-doped barium bromide iodide", Acta Crystallographica Section E, vol. 65, 2009, pp. i76-i77.
Gundiah et al, "Scintillation properties of Eu2+-activated barium fluoroiodide," IEEE Nuclear Sciences Symposium Conference Record 2009, pp. 1575-1578.
Hackenschmied et al., "Energy transfer in Ba1-xSrxFBr:Eu storage phosphors as a function of Sr and Eu concentration," Radiation Measurements, vol. 33, No. 5, 2001, pp. 669-674.
Selling et al., "Europium-doped barium halide X-ray scintillators," physica status solidi (c), vol. 4, No. 3, Mar. 2007, pp. 976-979.
Selling et al, "Eu- or Ce-Doped Barium Halide Scintillators for X-Ray and gamma-Ray Detections", IEEE Transactions of Nuclear Science, vol. 55, No. 3, Jun. 2008, pp. 1183-1185.
Non-Final Office Action from U.S. Appl. No. 14/047,893, dated Sep. 24, 2015.
Alekhin et al., "Scintillation properties and self absorption in SrI2:Eu2+," IEEE Transactions on Nuclear Science, vol. 58, No. 5, Oct. 2011, pp. 2519-2527.
Cherepy et al., "SrI2 scintillator for gamma ray spectroscopy," Proceedings of SPIE, vol. 7449, Sep. 11, 2009, pp. 74490F-1-74490F-6.
Final Office Action from U.S. Appl. No. 14/047,893, dated Apr. 27, 2016.

* cited by examiner

| Scintillator | ρ (g/cm³) | $Z_{eff}^a$ | Emission Peak (nm) | Estimated Band Gap, $E_g^b$ (eV) | Theoretical Maximum $LY^d$ (Ph/MeV) | Measured β LY (Ph/MeV) | Measured γ LY (Ph/MeV) | Measured LY Resolution (662 keV) |
|---|---|---|---|---|---|---|---|---|
| SrI₂ undoped | 4.549 | 49.4 | 560 | 3.7 | 111,000 | 62,000 | 22,000 | 6.7% |
| SrI₂ (Eu, 6%) | 4.549 | 49.4 | 435 | 3.7 | 111,000 | 110,000 | 115,000 | 2.8% |
| SrBr₂ (Eu, 0.5%) | 4.216 | 36.1 | 410 | 4.0 | 100,000 | 25,000 | 20,000 | 7% |
| BaI₂ (Eu, 0.5%) | 5.150 | 54.1 | 422 | 3.9 | 103,000 | 40,000 | 35,000 | 8% |
| BaBr₂ (Eu, 0.1%) | 4.781 | 45.5 | 406 | 4.1 | 98,000 | 22,000 | 16,000 | 11% |
| CaI₂ (Eu, 0.5%) | 4.000 | 48.0 | 467 | 3.5 | 114,000 | 110,000 | 110,000 | 5.2% |
| LaBr₂ (Ce) | 5.080 | 44.1 | 360 | 4.5 | 89,000 | 60,000 | 60,000 | 2.6% |

FIG. 5

BARIUM IODIDE AND STRONTIUM IODIDE CRYSTALS AND SCINTILLATORS IMPLEMENTING THE SAME

RELATED APPLICATIONS

This application is a continuation in part of U.S. application Ser. No. 14/047,893, filed Oct. 7, 2013, which is a continuation of U.S. application Ser. No. 12/255,375, filed Oct. 21, 2008, each of which is herein incorporated by reference.

This application claims priority to provisional U.S. application Ser. No. 60/988,475 filed on Nov. 16, 2007, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to scintillator crystals, and more particularly to ionic iodide-containing crystals and scintillator detectors employing the same.

BACKGROUND

Detection and classification of gamma ray emitters has attained heightened importance in the protection of vulnerable targets and populaces from high energy explosives. Many nuclear explosives emit gamma rays, due to radioactive decay of the materials comprising the explosives. However, many less harmful and non-explosive materials also emit gamma rays. Therefore, it is desirable to be able to identify, and whenever possible, distinguish between the types of gamma ray emitters in an unknown material, possibly further concealed inside of a container or vehicle of some type, such as a car, van, cargo container, etc.

Many types of materials emit gamma rays that appear very close together on a gamma spectrograph. Scintillator detectors use crystals that emit light when gamma rays interact with the atoms in the crystals. The intensity of the light emitted can be used to determine the type of material that is emitting the gamma rays. Scintillator detectors may also be used to detect other types of radiation, such as alpha, beta, and x-rays. High energy resolution scintillator detectors are useful for resolving closely spaced gamma ray lines in order to distinguish between gamma emitters producing closely spaced gamma ray lines.

With respect to ytterbium as an activator dopant in scintillation radiation detectors, while some research has indicated the capacity for ytterbium (II) to luminesce in response to excitation by ultraviolet radiation, these findings neither demonstrate nor suggest that the corresponding material would exhibit similar, or indeed any, radioluminescence in response to excitation by other radiation sources (particularly gamma rays and/or neutron radiation). Accordingly, to date there is neither investigative nor demonstrative research exalting the utility (or lack thereof) of ytterbium as an activator dopant in a scintillation radiation detector capable of detecting ionizing radiation including gamma radiation and/or neutron radiation. Moreover, existing studies of ytterbium (II) luminescence have often demonstrated a characteristically "anomalous" emission band that is considered disadvantageous to scintillation radiation detector materials configured to detect ionizing radiation.

Detection sensitivity for weak gamma ray sources and rapid unambiguous isotope identification is principally dependent on energy resolution, and is also enhanced by a high effective atomic number of the detector material. Generally, gamma ray detectors are characterized by their energy resolution. Resolution can be stated in absolute or relative terms. For consistency, all resolution terms are stated in relative terms herein. A common way of expressing detector resolution is with Full Width at Half Maximum (FWHM). This equates to the width of the gamma ray peak on a spectral graph at half of the highest point on the peak distribution.

The relative resolution of a detector may be calculated by taking the absolute resolution, usually reported in keV, dividing by the actual energy of the gamma ray also in keV, and multiplying by 100%. This results in a resolution reported in percentage at a specific gamma ray energy. The inorganic scintillator currently providing the highest energy resolution is $LaBr_3(Ce)$, with about 2.6% at 662 keV, but it is highly hygroscopic, its growth is quite difficult and it possesses natural radioactivity due to the presence of primordial $^{138}La$ that produces betas and gamma rays resulting in interference in the gamma ray spectra acquired with $LaBr_3(Ce)$. Therefore, it is desirable to have a scintillator detector that is capable of distinguishing between weak gamma ray sources that is more easily grown while still providing high energy resolution.

SUMMARY

In one embodiment, a crystal includes at least one metal halide; and an activator dopant comprising ytterbium.

In another embodiment, a scintillator optic includes: at least one metal halide doped with a plurality of activators, the plurality of activators comprising: a first activator comprising europium, and a second activator comprising ytterbium.

In yet another embodiment, a method for manufacturing a crystal suitable for use in a scintillator includes mixing one or more salts with a source of at least one dopant activator comprising ytterbium; heating the mixture above a melting point of the salt(s); and cooling the heated mixture to a temperature below the melting point of the salts.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 5 is a chart comparing eight different measured or calculated characteristics for seven different scintillator materials.

DETAILED DESCRIPTION

Figure 1:
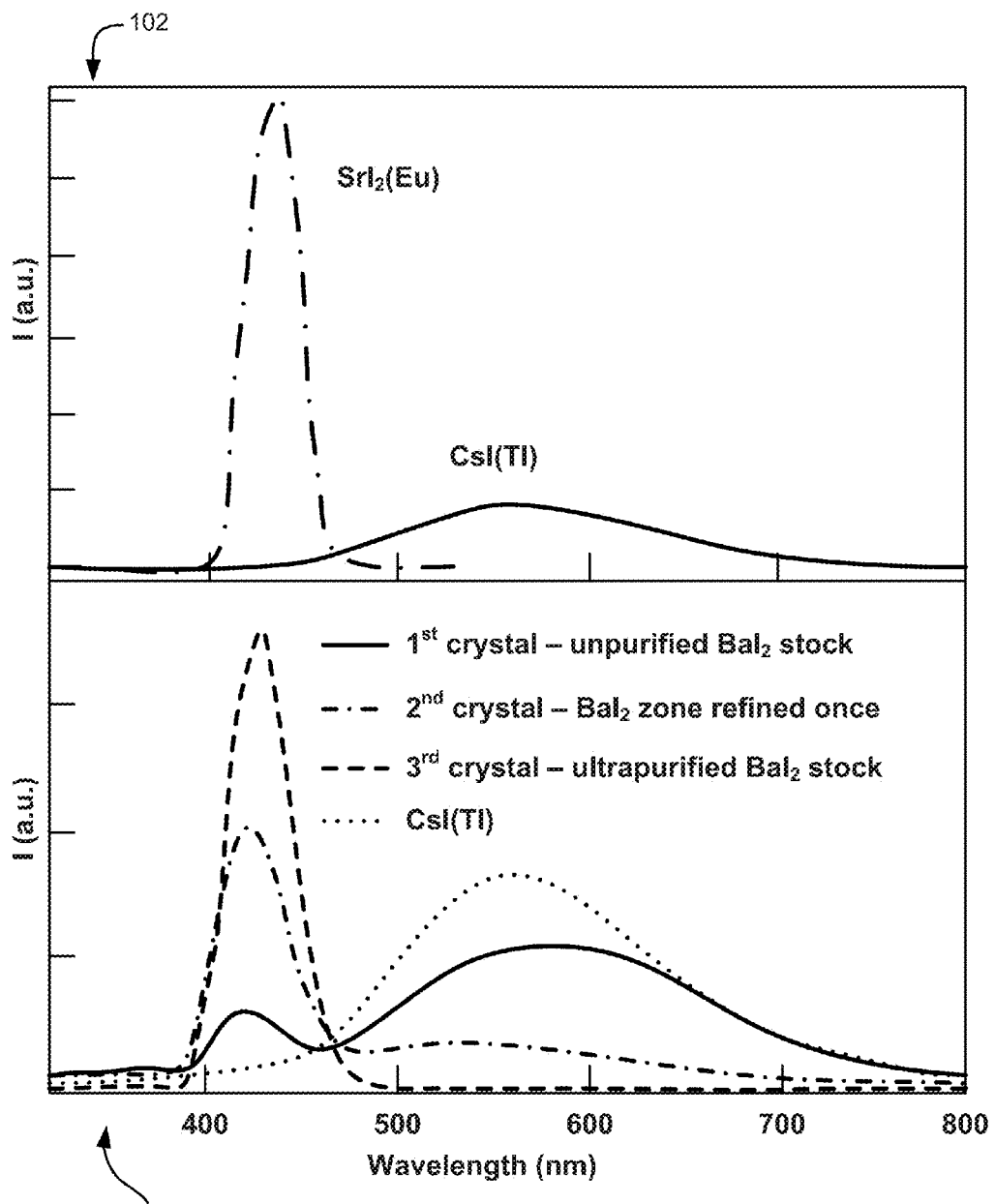
FIG. 1 illustrates two plots of relative intensity versus wavelength for several scintillator samples.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Several crystalline iodides are known to function usefully as scintillators, including NaI(Tl), CsI(Na), CsI(Tl), and $LuI_3(Ce)$. NaI(Tl) is by far the most common scintillator, being grown in large sizes by numerous companies and deployed in many commercial instruments. However, NaI (Tl) offers a modest light yield, which limits the gamma ray energy resolution which is possible (about 40,000 photons/MeV). $CaI_2(Eu)$ and $LuI_3(Ce)$ both have higher light yields (about 70,000-100,000 photons/MeV) but are exceedingly difficult to grow and the latter contains Lu as a constituent (which is a natural beta-emitter leading to an undesirable background count rate). Interestingly, $LaI_3(Ce)$ has also been tested as a potential scintillator, but was found to be non-emissive at room temperature.

Two materials have been found to have great utility as high energy scintillators: $SrI_2(Eu)$ and $BaI_2(Eu)$, which may resolve the problems facing the related compounds $LuI_3(Ce)$ and $CaI_2(Eu)$. Other related compounds currently being used as scintillators include Ce-doped $LaCl_3$ and $LaBr_3$, which both have very high light yields but have a lower atomic number (Z) than the iodides (Z of Cl, Br, I are 17, 35, 53, respectively)—the Z is a critical parameter since gamma photoelectric absorption goes approximately as its fourth power, $Z^4$. As a consequence, iodides are preferred as constituents in scintillators versus bromides and chlorides, assuming other features are comparable.

In one embodiment, a scintillator detector makes use of $SrI_2$ or $BaI_2$ crystals for the purpose of gamma ray detection, based on measuring the amount of scintillation luminescence generated by the material. For this purpose, the crystal may be doped or undoped, giving rise to excitonic (undoped), perturbed excitonic (e.g., Na, Mg, Ca, Sc or other doping of electronically inactive species), or activator luminescence (e.g., $Eu^{2+}$, $Ce^{3+}$, $Pb^{2+}$, $Tl^+$, $Pr^{3+}$).

Undoped $SrI_2$ has a useful light yield, but its energy resolution with standard photomultiplier tubes is only fair, due to its emission being long wavelength. When a $Eu^{2+}$ activator is used, emissions in the blue region are observed. Contrary to conventional wisdom and earlier findings, a scintillator optic comprising $SrI_2$ doped with Eu, especially $Eu^{2+}$, has been found to provide a high energy resolution. For example, a $SrI_2(Eu)$ crystal grown by the inventors evidenced an energy resolution of <2.7% at 662 keV, challenging the performance of $LaBr_3(Ce)$ obtained under the same conditions.

An intriguing factor appears relevant to the excellent performance of $SrI_2(Eu)$. That is, the lattice constants for $SrI_2$ and $EuI_2$ are nearly identical, thus permitting high doping of Eu in $SrI_2$. Other favorable aspects of $SrI_2$ include its low melting point, 538° C., and its orthorhombic crystal structure, which will likely be readily grown to large sizes.

The alpha particle-induced luminescence of $BaI_2(Eu)$ is similar to that of $Lu_3Al_5O_{12}(Ce)$, but shifted to shorter wavelength.

A marked advantage of using $SrI_2$ or $BaI_2$ crystals doped with Eu is the relative ease in which the crystals can be grown in large sizes. Another advantage is that $SrI_2(Eu)$ and $BaI_2(Eu)$ are less hygroscopic than $CaI_2(Eu)$ which is an important practical edge in using Sr or Ba instead of Ca.

In a first general embodiment, a material comprises a crystal, which is comprised of strontium iodide (doped or undoped) providing at least 50,000 photons per MeV. In one particularly preferred embodiment, the energy resolution of the crystal may be less than about 5.0% at 662 keV, as being enhanced by doping, e.g., with Ce or Eu.

In the first general embodiment, the crystal may be doped with europium in different percentages, such as containing more than 1.6% europium, containing between about 0.5% and about 8.0% europium, and containing more than 2.0% europium.

Figure 8:
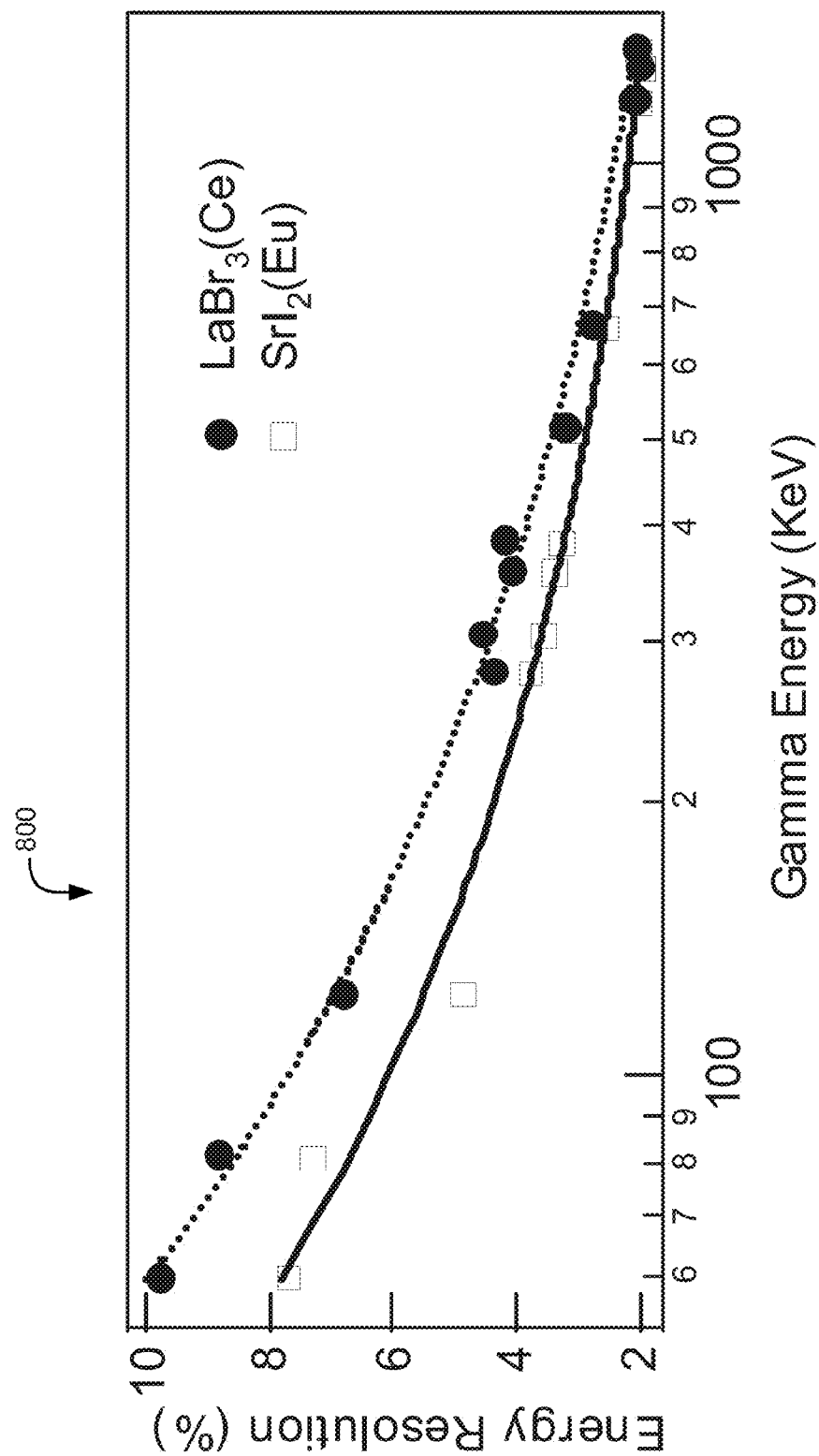
FIG. 8 is a chart of energy resolution as a function of gamma ray energy acquired for $SrI_2(Eu)$ and $LaBr_3(Ce)$ crystals.

In addition, the europium in the crystal may be primarily $Eu^{2+}$. The use of $Eu^{2+}$ surprisingly provides excellent energy resolution, e.g., less than about 2.7%) at 662 keV. As noted above, conventional wisdom and a previous report indicated that such energy resolution was impossible for such a material. To exemplify, FIG. 8 is a chart 800 depicting energy resolution as a function of gamma ray energy acquired for $SrI_2$ (5% Eu) and $LaBr_3(Ce)$ crystals. These crystals are the same as used below in Example 4. As shown, the energy resolution of $SrI_2$ (5% Eu) is comparable or slightly better than that of $LaBr_3(Ce)$.

Another variation of the first general embodiment is where the crystal has at least one dopant, selected from: cerium, praeseodymium, thallium, or lead.

The first general embodiment may further include barium in the crystal, or the crystal may provide at least 60,000 photons per MeV. Further, the resolution of the crystal may be less than about 5%, less than about 4.0%, etc, at 662 keV.

In a second general embodiment, a scintillator radiation detector comprises a scintillator optic comprised of strontium iodide (doped or undoped) providing at least 50,000 photons per MeV. In one particularly preferred embodiment, the energy resolution of the crystal may be less than about 5.0% at 662 keV.

Also, in the second general embodiment, the scintillator optic may contain more than 1.6% europium, may contain between about 0.5% and about 8.0% europium, or may contain more than 2.0% europium. In addition, the europium may be primarily $Eu^{2+}$. Further, the scintillator optic may include barium and/or calcium.

With continued reference to the second general embodiment, the scintillator optic may provide at least 60,000 photons per MeV, and may have a resolution of less than or about 4.0% at 662 keV.

In a third general embodiment, a scintillator radiation detector comprises a scintillator optic comprised of $SrI_2$ and $BaI_2$, wherein a ratio of $SrI_2$ to $BaI_2$ is in a range of between 0:1 and 1:0.

In the third general embodiment, the scintillator optic may provide at least 50,000 photons per MeV and energy resolution of less than about 5.0% at 662 keV.

Further, the scintillator optic may contain europium, and the europium may be primarily $Eu^{2+}$. In addition, the scintillator optic may provide at least 80,000 photons per MeV, and may contain at least one dopant, selected from: cerium, praeseodymium, thallium, or lead.

In a fourth general embodiment, a scintillator radiation detector comprises a scintillator optic comprising barium iodide.

In the fourth general embodiment, the scintillator optic may be doped with at least one of cerium, praeseodymium, thallium, lead, indium, or a transition metal ion. Also, the scintillator optic may be doped with an activator that luminesces in response to gamma radiation.

In the fourth general embodiment, the activator may include an ion which luminesces via a 5d→4f transition or the activator may include an $s^2$ ion or a closed shell ion. Further, the activator may be a transition metal ion.

In a fifth general embodiment, an iodide crystal comprises a single metal ion (M, M' or M") with the formula $MI_2$, $M'I_3$, or $M''I_4$, where M or M' has an atomic number >40, but is not Y, Sc, La, Lu, Gd, Ca, Sr or Ba. M" may or may not have an atomic number greater than 40.

In a sixth general embodiment, a scintillator optic comprises at least one metal halide doped with ytterbium. Preferably, but not necessarily, the material is in the form of a single crystal.

The material of the sixth general embodiment preferably includes one or more alkali halide and/or one or more alkaline earth halides as the metal halide component. Suitable alkali metals include lithium, sodium, potassium, and cesium, with cesium being particularly preferred. Suitable alkaline earth metals include beryllium, magnesium, calcium, strontium, and barium, with calcium, strontium and barium being particularly preferred. Suitable halides include fluorine, bromine, chlorine and iodine, with iodine being particularly preferred.

For example, in one approach at least one alkaline earth halide doped with an activator compound is included in the scintillator optic. For example, the optic may include strontium iodide doped with ytterbium as the activator compound, and preferably doped with divalent ytterbium (a.k.a, "ytterbium (II)" or "$Yb^{2+}$").

In at least some approaches, the material comprises one or more alkaline earth halide salts, preferably alkaline earth iodides such as strontium (II) iodide and/or barium (II) iodide, although other alkaline earth halides are also suitable for use in scintillator optics and should be understood to generally fall within the scope of the presently described sixth general embodiment.

The alkaline earth halide(s) of the sixth general embodiment are doped with an activator comprising a rare-earth element. More preferably, the rare-earth element is a lanthanide series element, and most preferably the rare-earth material is ytterbium.

In more variations on the sixth general embodiment, the dopant activator may include one or more rare earth elements, such as preferably including both europium and ytterbium. In particularly preferred approaches, the ytterbium may be included in an amount greater than the europium.

Without wishing to be bound to any particular theory, the inventors theorize that advantageous energy transfer from the ytterbium dopant to the europium dopant advantageously mitigates light-trapping otherwise experienced by the europium dopant in compositions excluding ytterbium, or in compositions in which the ytterbium component is present in an amount less than or equal to the europium dopant, thereby increasing the overall light yield and suitability of the optic for application as a scintillator detector.

In the sixth general embodiment, the ground state of the activator preferably is characterized by a $4f^{14}$ electronic structure, a completely filled shell, (indicating that the ground state is a singlet, $^1S_0$ state. The first excited state is therefore preferably derived from a $4f^{13}5d$ atomic state, and the absorption results from the 4f-to-5d transition. Similarly, in some embodiments but not all, the emission results from an inverse transition, i.e. 5d-to-4f.

In a seventh general embodiment, a crystal includes at least one metal halide; and an activator dopant comprising ytterbium.

In an eighth general embodiment, a scintillator optic includes: at least one metal halide doped with a plurality of activators, the plurality of activators comprising: a first activator comprising europium, and a second activator comprising ytterbium.

In a ninth general embodiment, a method for manufacturing a crystal suitable for use in a scintillator includes mixing one or more salts with a source of at least one dopant activator comprising ytterbium; heating the mixture above a melting point of the salt(s); and cooling the heated mixture to a temperature below the melting point of the salts.

In some approaches, the crystal may be characterized by characteristics of growth using a particular technique or methodology, such as growth from solution, growth from a melting process, etc. as would be understood by one having ordinary skill in the art upon reading the present descriptions. Preferably, these crystal growth characteristics (whether from melt, solution, or otherwise) include the scintillator optic comprising at least one single crystal.

With respect to crystal size, in some approaches the crystal growth characteristics include the scintillator optic comprising at least one single crystal having at least one face with an area of approximately one square centimeter (1 $cm^2$), or more preferably the at least one single crystal having a volume of at least approximately one cubic centimeter (1 $cm^3$).

As understood herein, a "single crystal" is a solid material characterized by arrangement of the constituent atoms in a crystalline lattice. The crystal furthermore exists as a single, continuous, uninterrupted region of the solid material, i.e. a single crystalline phase uninterrupted by grain boundaries, inclusions, impurities, etc. as would be understood by one having ordinary skill in the art upon reading the present descriptions.

Another way of expressing the "single crystal" concept described presently is to consider a "single crystal" as being embodied as a single grain of the corresponding crystalline material and having the corresponding spatial dimensions. In one exemplary instance within the scope of the sixth general embodiment, a "single crystal" of ytterbium-doped strontium iodide" is a single grain of solid material embodied as a crystalline lattice throughout which the strontium, iodine and ytterbium atoms are distributed. The single grain is uninterrupted by inclusions, impurities or grain boundaries, and is further characterized by having at least two, and preferably three, perpendicularly-oriented (or orthogonal, in other terms) dimensions each being at least about one centimeter in length, i.e. an area of at least about one square centimeter or a volume of at least about one cubic centimeter, respectively.

The single crystal may be joined to one or more additional single crystals in a complex, with each crystal being separated by one or more crystal grain boundaries.

Any of the general embodiments may include further limitations as directed below. In addition, combinations of the additional limitations directed below may be combined to create even more permutations and combinations of features.

EXAMPLES

To demonstrate various embodiments of the present invention, several examples are provided bellow. It should be appreciated that these are presented by way of nonlimiting example only, and should not be construed as limiting.

Example 1

Strontium iodide and barium iodide crystals were grown in quartz crucibles using the Bridgman method. The melting points of $SrI_2$ and $BaI_2$ are 515° C. and 711° C., respectively; both possess orthorhombic symmetry while calcium iodide is hexagonal. All crystals described in this section were doped with 0.5 mole % europium and were several cubic centimeters per boule, then cut into ~1 cm³ pieces for evaluation. Barium iodide as-supplied powder, 99.995% pure ultradry (Alfa Aesar) was yellowish in color (thought to be due to oxide or oxyiodide contamination). Crystals grown directly from as-supplied powders retained a dark coloration (referred to henceforth as "first crystal"), Zone refining rendered the starting powders colorless, and the resulting pure powders were used to grow several crystals (referred to as "second crystal," although several were grown following this procedure). Finally, an ultrapurification method was used to grow a $BaI_2$(Eu) crystal, referred to as "third crystal."

Radioluminescence spectra were acquired using a $^{90}Sr/^{90}Y$ source (average beta energy ~1 MeV) to provide a spectrum expected to be essentially equivalent to that produced by gamma excitation. Radioluminescence spectra were collected with a spectrograph coupled to a thermoelectrically cooled camera and corrected for spectral sensitivity. The beta-excited luminescence of $SrI_2$ (0.5% Eu) compared to that of a standard scintillator crystal, CsI(T1), is shown in FIG. 1 in the upper plot 102, along with a $SrI_2$(Eu) crystal grown at RMD. It possesses a single band centered at 435 nm, assigned to the $Eu^{2+} d \rightarrow f$ transition, and an integrated light yield of 93,000 photons/MeV. FIG. 1 in the lower plot 104 shows beta-excited luminescence spectra of three $BaI_2$ (Eu) crystals compared to a CsI(T1) standard crystal. The $Eu^+$ luminescence at ~420 nm is enhanced in the second $BaI_2$(Eu) crystal, while the ~550 nm band is reduced, and for the third crystal, the ~550 nm band is entirely absent. It is notable that the overall light yield is highest for the first crystal; its integral light yield (including both the 420 nm and the 550 nm bands) is 60,000 photons/MeV, The weak band at 550 nm may be assigned to an impurity-mediated recombination transition.

Example 2

Calcium iodide and strontium bromide crystals were grown via the Bridgman method, with 0.5% Europium doping. The $CaI_2$(Eu) crystal is substantially opaque due to optical scatter, considered unavoidable due to its platelet crystal structure. Its radioiuminescence spectrum was measured at 110,000 Ph/MeV, and is shown in the chart 200 of FIG. 2. $SrBr_2$(Eu) is an orthorhombic crystal with good optical properties, however, its light yield so far is low (~25,000 Ph/MeV). All radioiuminescence spectra reported herein were acquired with a $^{90}Sr/^{90}Y$ source (~1 MeV average beta energy) and emission spectra were collected using a Princeton Instruments/Acton Spec 10 spectrograph coupled to a thermoelectrically cooled CCD camera.

Example 3

Figure 2:
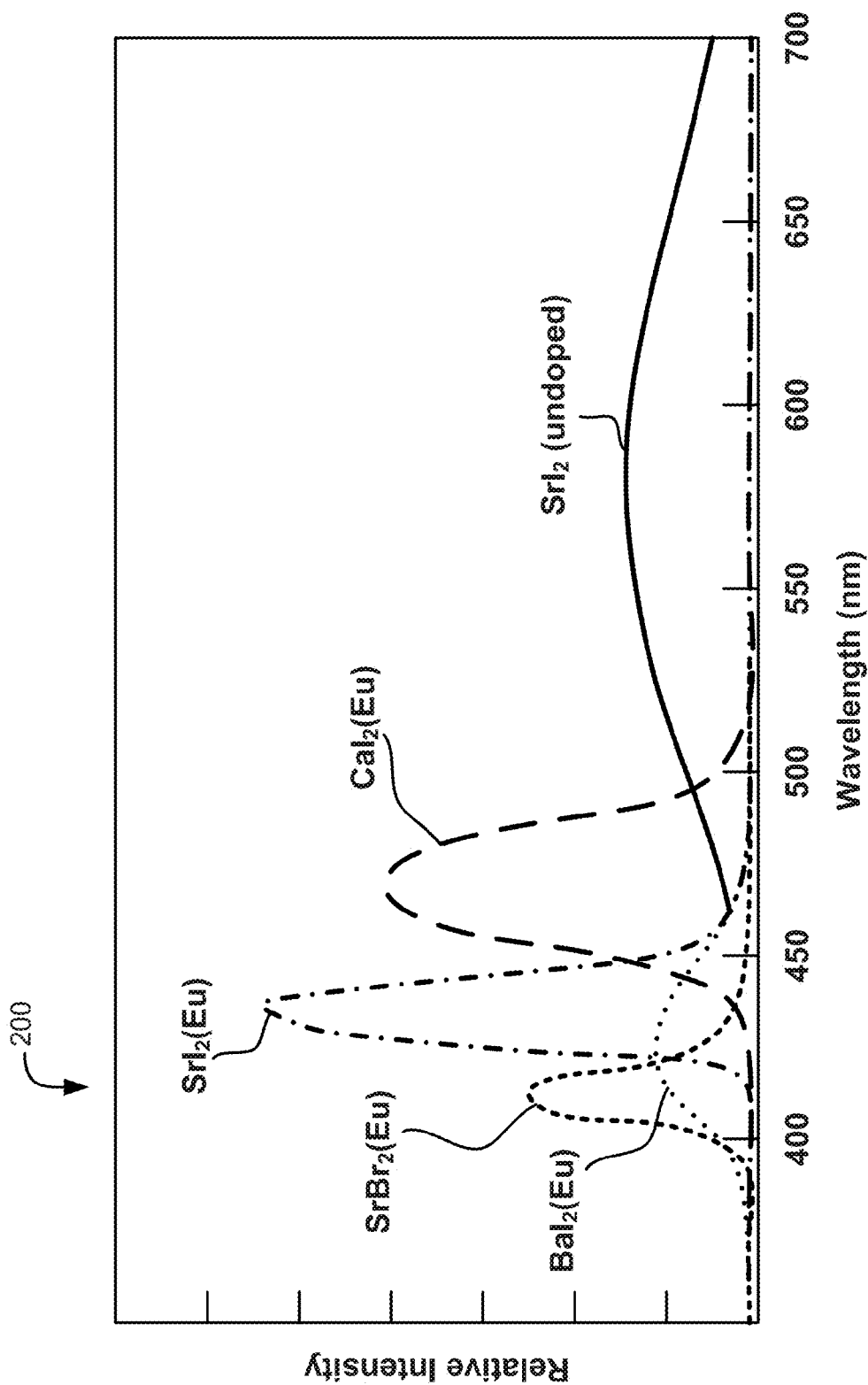
FIG. 2 is a plot of relative intensity versus wavelength for five scintillator samples.
Figure 3:
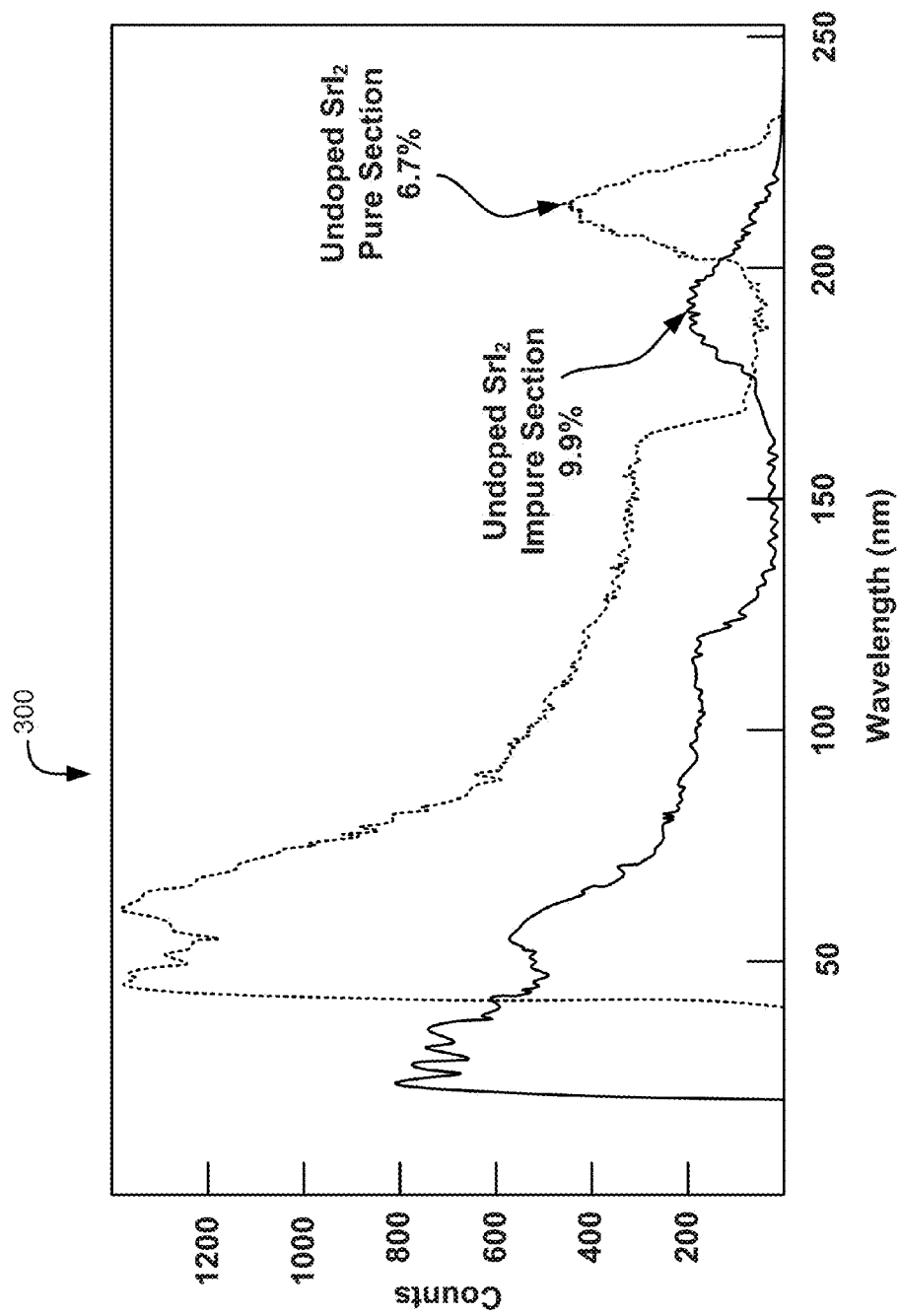
FIG. 3 is a plot of counts versus wavelength for undoped $SrI_2$ in pure and impure forms.

Undoped strontium iodide was grown and zone-refined. The luminescence spectrum, shown in FIG. 2, is unchanged between pure and impure segments of the boule, however, the pulse height spectrum of the purer section is slightly higher. Pulse height measurements, shown in the chart 300 of FIG. 3, were acquired using a Hamamatsu R329EGP PMT (QE at 550 nm of 15%). The signals from the PMT anode were collected on a 500 Ω resistor, shaped with a Tennelec TC 244 spectroscopy amplifier (shaping time of 8 μs) and then recorded with the Amptek MCA8000-A multichannel analyzer. The emission is likely due to self-trapped excitons, as it is present for all un-doped samples.

Example 4

Figure 4A:
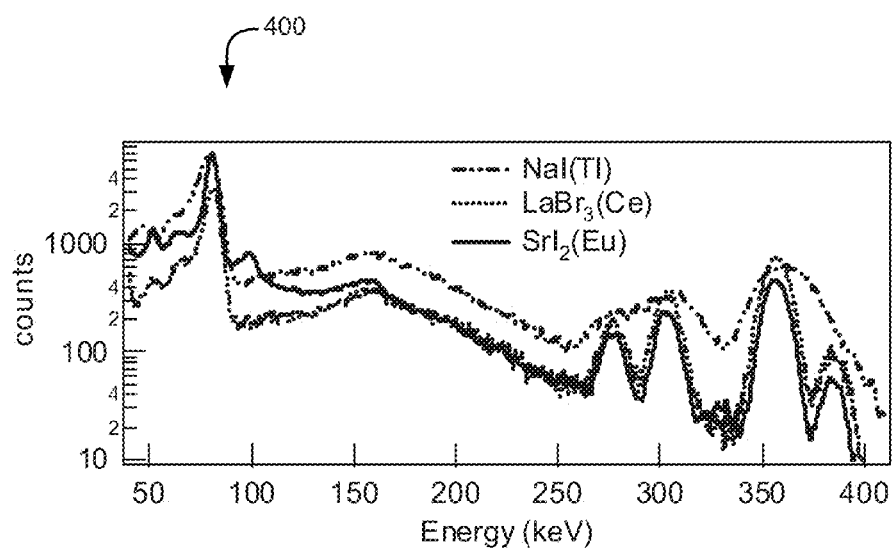
FIG. 4A is a plot of gamma ray spectra acquired with $LaBr_3(Ce)$, $SrI_2$ (5% Eu), and NiI(T1) scintillators of the $^{133}Ba$ source.

A scintillator crystal of strontium iodide doped with 5% europium, a scintillator crystal of $LaBr_3$(Ce), and a scintillator crystal of NiaI(T1) were acquired and exposed to a $^{133}Ba$ source. Acquisition parameters (e.g., shaping time, gain) were optimized for each crystal to give the best results for the particular crystal. The resulting gamma ray spectra are shown in the chart 400 of FIG. 4A. As shown, the energy resolution of the $SrI_2$(Eu) is better than the energy resolution of the $LaBr_3$(Ce) in the low energy region.

Example 5

The same crystals used in Example 4 were exposed to a $^{137}Cs$ source, which is primarily monoenergetic. Again, acquisition parameters (e.g., shaping time, gain) were optimized for each crystal to give the best results for the particular crystal. The resulting gamma ray spectra are shown in the chart 402 of FIG. 4B. As shown, the energy resolution of the $SrI_2$(Eu) is comparable to the energy resolution of the $LaBr_3$(Ce).

Example 6

Figure 4B:
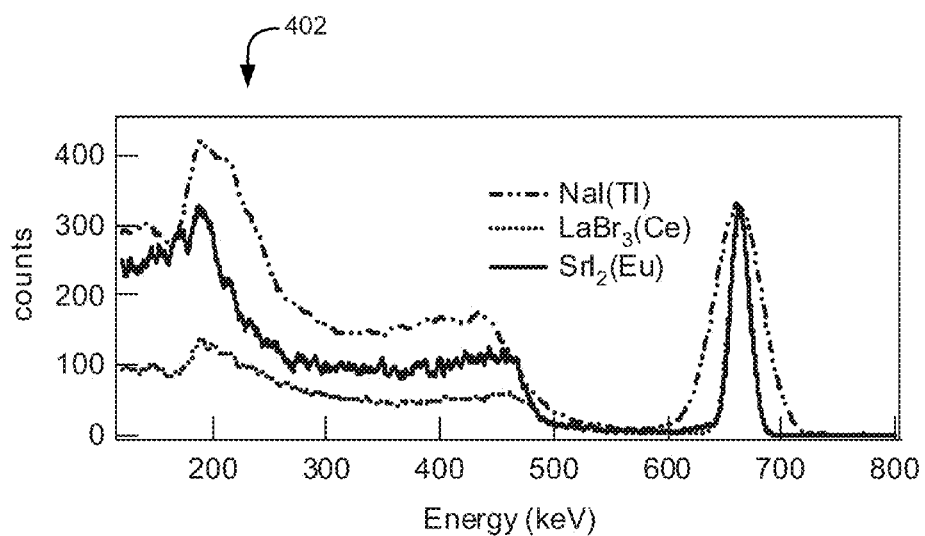
FIG. 4B is a plot of gamma ray spectra acquired with $LaBr_3(Ce)$, $SrI_2$ (5% Eu), and NiI(T1) scintillators of the $^{137}Cs$ source.

The same $LaBr_3$(Ce) and $SrI_2$(Eu) crystals used in Example 4 were exposed to a $^{137}Cs$ source, which is primarily monoenergetic. Again, acquisition parameters (e.g., shaping time, gain) were optimized for each crystal to give the best results for the particular crystal. The resulting gamma ray spectra are shown in FIG. 4B. As shown, the energy resolution of the $SrI_2(Eu)$ is comparable to the energy resolution of the $LaBr_3(Ce)$.

Example 7

Several crystals of barium iodide were grown and characterized. The radioluminescence of $BaI_2(Eu)$ typically shows both a long-wave band, similar to that seen in undoped $SrI_2$, as well as the $BaI_2(Eu)$ band shown in FIG. 2. The long-wave band, thought to be related to self-trapped exciton luminescence, is reduced as the Eu doping level is increased. However, even for crystals exhibiting only Eu luminescence, gamma light yields and energy resolution so far are modest (see the chart 500 of FIG. 5).

Example 8

Barium Bromide crystals were grown doped with Eu, but the light yields are <30,000 Ph/MeV. While it may be possible for the performance of $BaI_2$ and $BaBr_2$ to be improved, but energetic considerations, such as relative positions of the $Eu^{2+}$ states within the bandgap, may limit light yields. For example, the $Eu^{2+}$ excited state in $BaI_2$ may be too close to the conduction band to compete effectively with residual shallow traps, while this matter is resolved in $SrI_2$ since the $Eu^{2+}$ excited state is slightly lower with respect to the conduction band.

Therefore, of the alkaline earth halides, $SrI_2(Eu)$ appears most promising due to its very high light yield, good optical properties, ease of growth, high achievable doping with $Eu^{2+}$, $Z_{eff}$ higher than $LaBr_3(Ce)$, excellent light yield proportionality and demonstrated energy resolution of <2.7% at 662 keV. $CaI_2$ has not been effectively grown in large sizes and $SrBr_2$ has a low $Z_{eff}$, while $BaI_2$ and $BaBr_2$ have not demonstrated adequate light yields for high energy resolution.

Example 9

Figure 7:
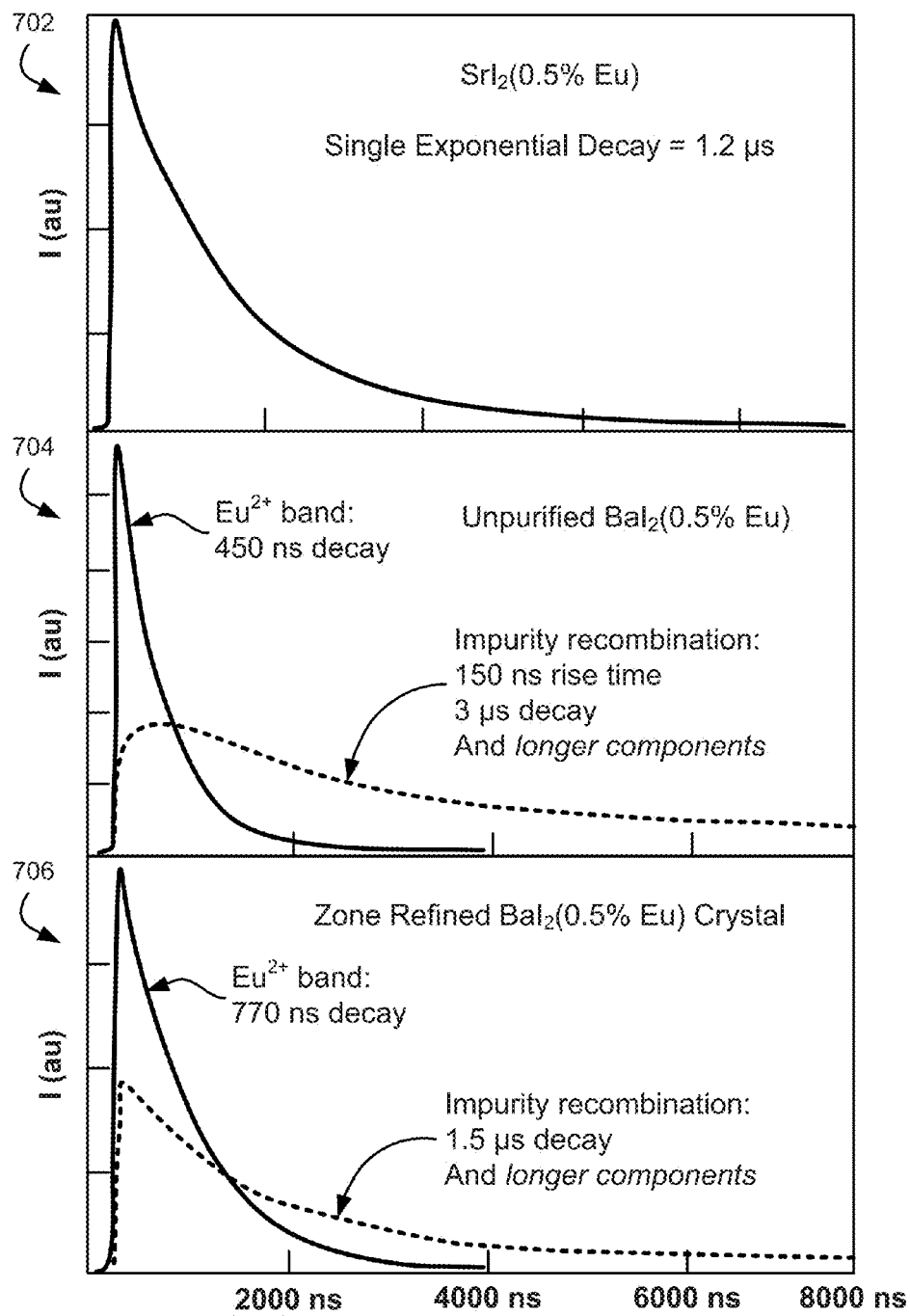
FIG. 7 illustrates three plots of relative intensity versus time for several scintillator samples.

Decay times were acquired using a flashlamp-pumped Nd:YAG laser using the $4^{th}$ harmonic at 266 nm, and 20 ns FWHM pulses. Luminescence was collected with a monochromator coupled to an R928 Hamamatsu PMT and read out by an oscilloscope. In $SrI_2(Eu)$, the $Eu^{2+}$ band decays with a 1.2 microsecond time constant as shown in FIG. 7, top plot 702. FIG. 7, middle plot 704, shows that for the $BaI_2(Eu)$ crystal grown with as-received powder, the $Eu^{2+}$ decay is about 450 ns while the impurity-mediated luminescence is slower, and cannot be fully integrated within an 8 µs shaping time. It is interesting that a component of the impurity-mediated recombination pathway is prompt (pulsewidth-limited) proceeding directly by trapping carriers from the conduction and valence band, but there is also a component that forms by depopulating the $Eu^{2+}$ excited state (possibly electrons trapped initially at $Eu^{2+}$ are able to thermally de-trap to the conduction band), as revealed by a rise-time component observed for 600 nm detection. Also, the impurity-mediated decay is very slow, on the tens of microseconds timescale (perhaps due to an exciton experiencing a triplet to singlet spin-forbidden transition). For $SrI_2(Eu)$, the $Eu^{2+}$ decay is about 770 ns, as shown in FIG. 7, bottom plot 706, effectively lengthened due to the reduction of de-trapping and excitation transfer to the impurity-mediated recombination pathway.

Example 10

Figure 9A:
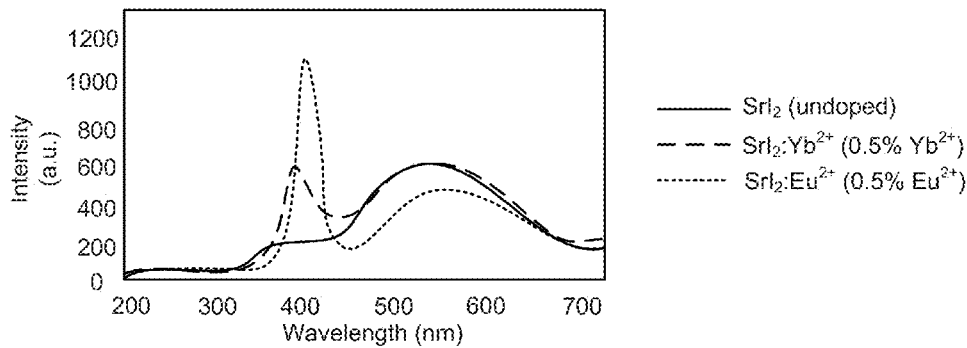
FIGS. 9A-9C depict emission spectra for ytterbium-containing and europium-containing scintillator optic compositions, according to various embodiments.
Figure 9B:
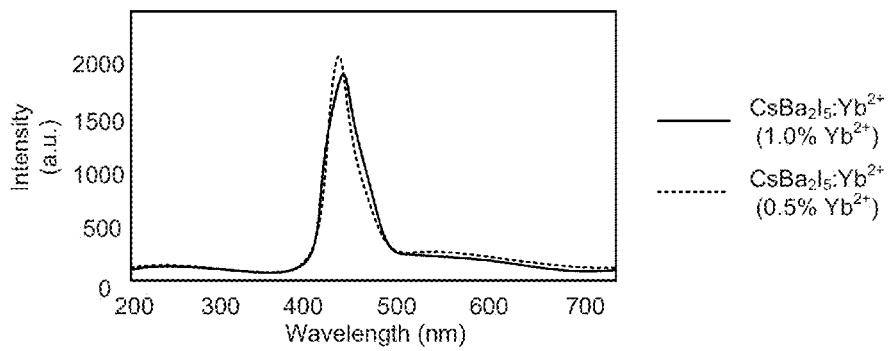
Figure 9C:
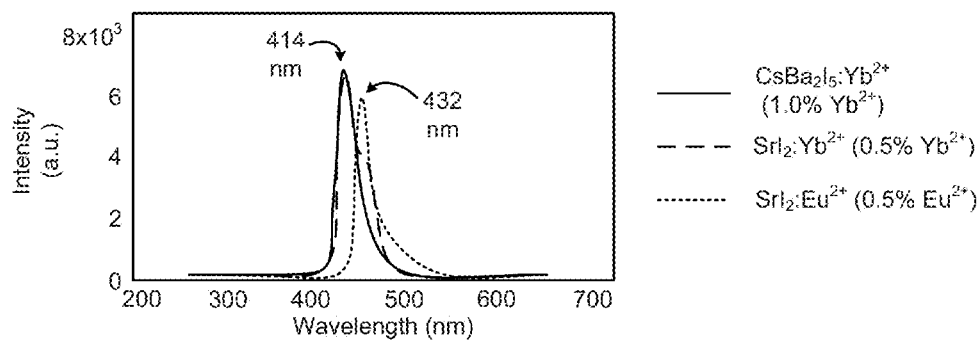

Referring now to FIGS. 9A-9C, which depict excitation spectra for several embodiments of a scintillator optic comprising halide salt(s) doped with ytterbium as an activator, it is apparent that these compositions exhibit advantageous excitation spectra for application in radiation detection endeavors.

For example, and according to various embodiments, the exemplary scintillator optic includes at least one metal cation and an at least one anion selected from a group consisting of: a borate, a carbonate, a nitrate, an oxide, a halide, a phosphate, a sulfide, a selenide, and a telluride. More specifically, the halides are preferably salts selected from one or more of magnesium iodide; calcium iodide strontium iodide; barium iodide; lithium iodide; sodium iodide; potassium iodide; rubidium iodide; and cesium iodide.

Referring now to FIG. 9A, exemplary beta-excitation spectra for strontium iodide-containing compositions are compared, highlighting the unique spectral characteristics of strontium iodide doped with approximately 0.5% europium, 0.5%) ytterbium, and undoped, as respectively indicated by the dotted, dashed and solid lines.

Notably, according to the experimental data summarized in FIG. 9A, the strontium iodide doped with europium exhibits an emission intensity of at least approximately 45,000 photons/MeV, while the strontium iodide doped with ytterbium exhibits an intensity of at least approximately 56,000 photons/MeV in response to excitation by electromagnetic radiation within the depicted spectral band (e.g. about 100-700 nm wavelength).

As illustrated in FIG. 9A, while all three embodiments exhibit the band-edge emission starting at approximately 380 nm, in the undoped strontium iodide material, this weak emission is dominated by the stronger emission in the region spanning approximately 500-650 nm (presumably due to defect-mediated exciton action).

By contrast, the excitation spectra for strontium iodide doped with either europium or ytterbium exhibit strong emission peaks at approximately 380 nm, with experimental results indicating increased light yield is at least partially due to the dopant activator shifting the dominant excitation events toward the corresponding emission peak of the dopant (approximately 380 nm for both europium and ytterbium).

With reference to FIG. 9B, exemplary beta-excitation spectra for cesium barium iodide doped with 1.0% ytterbium (solid line) and 0.5% ytterbium (dotted line) are illustrated for comparison. The spectra depicted in FIG. 9B reveal a strong emission band at approximately 414 nm. The experimental data from which FIG. 9B is compiled indicate the ytterbium-doped embodiments exhibit an emission intensity of approximately at least about 51,000 photons/Me V at a doping concentration of about 0.5%, while a doping concentration of about 1.0% yields an emission intensity of approximately about 50,000 photons/MeV or more, in various approaches.

Now with reference to FIG. 9C, an exemplary comparison of ultraviolet (UV) excitation spectra for strontium iodide doped with 0.5% europium (dotted line), strontium iodide doped with 0.5% ytterbium (dashed line), and cesium barium iodide doped with 0.5% ytterbium (solid line) are depicted, according to one embodiment. Each of the ytterbium-doped embodiments (regardless of halide salt identity) exhibited strong excitation peaks at approximately 414 nm, which correspond to excitation of $Yb^{2+}$, while the europium-doped strontium iodide exhibits an excitation peak at approximately 432 nm, corresponding to excitation of $Eu^{2+}$, as would be expected. Notably, however, the ytterbium-doped strontium iodide sample also exhibits a characteristic shoulder at approximately 432 nm, which is theorized to be due to minute presence of europium impurities in the starting materials from which the crystals were manufactured.

Figure 10A:
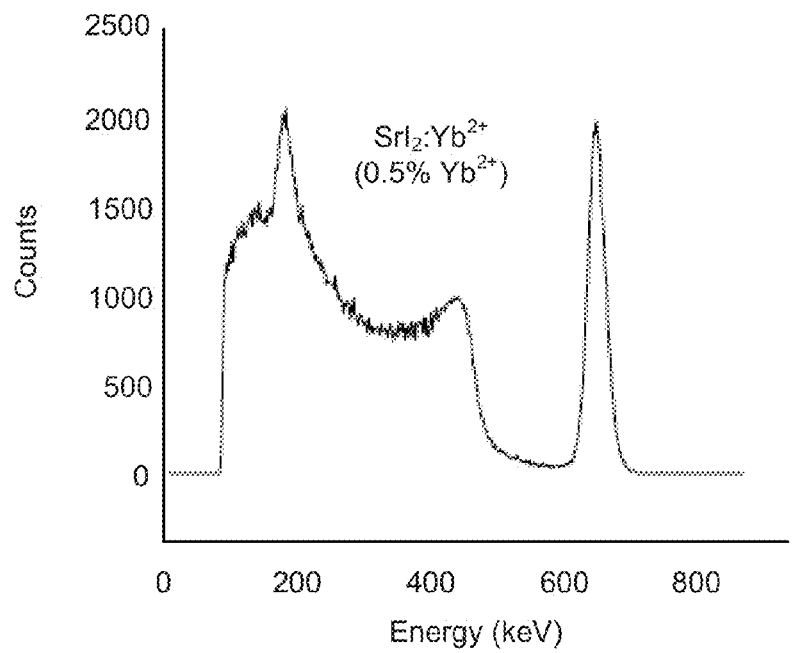
FIG. 10A is a pulse height spectrum for a scintillator optic comprising ytterbium doped strontium iodide, according to one embodiment.
Figure 11A:
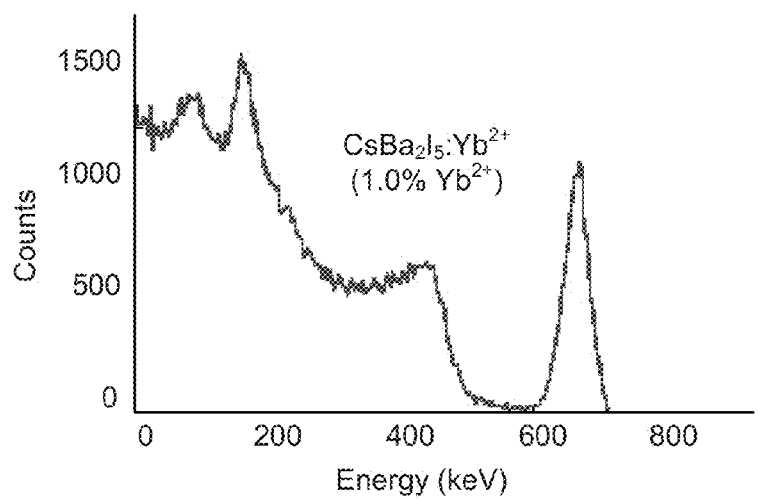
FIG. 11A is a pulse height spectrum for a scintillator optic comprising a mixture of ytterbium doped cesium iodide and barium iodide, according to one embodiment.

For example, and as shown in FIGS. 10A and 11A, exemplary pulse height spectra are displayed. The exemplary spectra correspond to a scintillator optic comprising strontium iodide (FIG. 10A) or cesium barium iodide (FIG. 11A), each doped with approximately 0.5% ytterbium. For each composition, the spectrum was generated using a $^{137}$Cs radiation source.

Similar to the depictions in FIGS. 10A and 10B, FIGS. 11A and 11B illustrate the pulse height spectrum (again, corresponding to $^{137}$Cs) and emission lifetime curve for a scintillator optic comprising cesium barium iodide doped with approximately 1.0% ytterbium, according to one embodiment.

Referring again to FIGS. 10A and 10B, these Figures depict a pulse height spectrum and scintillator decay timing, respectively, for strontium iodide doped with $Yb^{2+}$ (0.5%) according to one embodiment. The Figures demonstrate how the scintillator optic compositions disclosed herein comprising strontium iodide doped with ytterbium exhibit pulse height spectra and emission lifetime curves indicating suitability for utilizing these materials for the detection of ionizing radiation such as gamma rays in various embodiments.

For example, as shown in FIG. 10A, the exemplary strontium iodide scintillator optic (a substantially pure single crystal of ytterbium-doped strontium iodide having a volume of approximately 130 cubic millimeters) doped with ytterbium (II) exhibits a resolution of approximately 4.65% at 662 keV, in one embodiment.

Figure 10B:
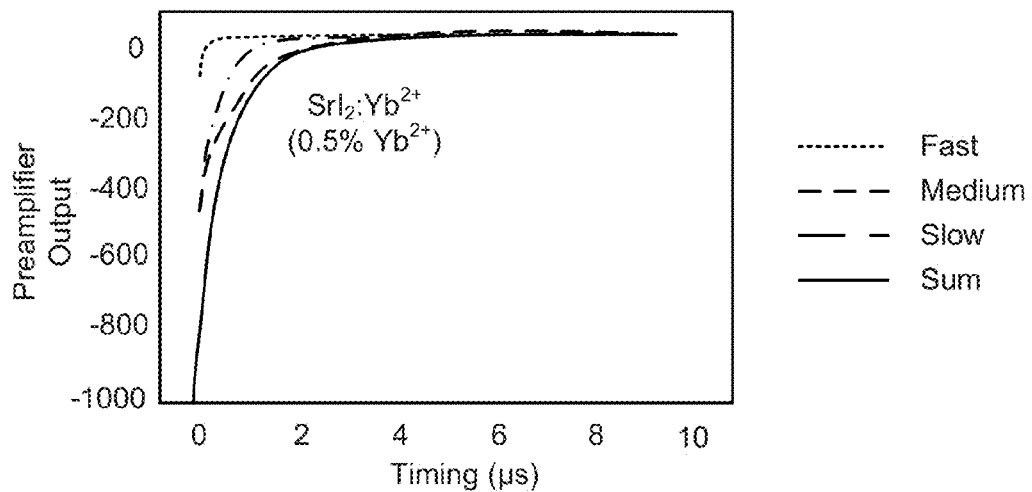
FIG. 10B is a scintillation decay timing plot for one embodiment of a scintillator optic comprising ytterbium doped strontium iodide.

Similarly, and as shown in FIG. 10B, the exemplary scintillator optic comprising strontium iodide doped with ytterbium exhibits fast, mid-slow (a.k.a. "medium") and slow decay components. Each decay component is respectively characterized by a decay time of about 62 (±4) nanoseconds for the fast component, corresponding to about 1.1% of the total light produced by the scintillator; about 400 (±15) nanoseconds for the mid-slow component, corresponding to approximately 32.3%) of the total light produced by the scintillator; and about 920 (±20) nanoseconds for the slow component, corresponding to the remaining approximately 66.6% of the light produced by the scintillator.

Referring now to compositions of the scintillator optic including cesium barium iodide doped with ytterbium as disclosed herein, an exemplary pulse height spectrum is shown in FIG. 11A, according to one embodiment. The exemplary scintillator optic including cesium barium iodide doped with ytterbium is characterized by an energy resolution of approximately 5.7% at about 662 keV.

Figure 11B:
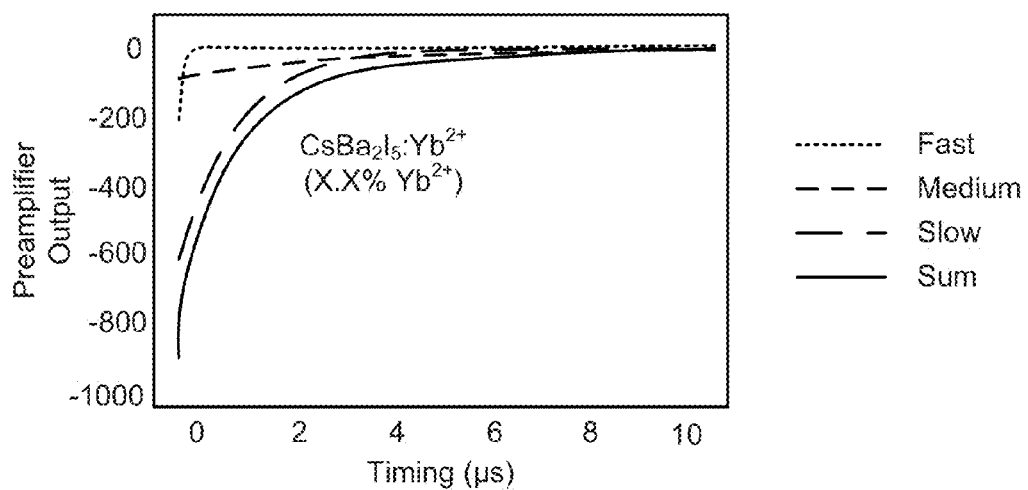
FIG. 11B is a scintillation decay timing plot for one embodiment of a scintillator optic comprising a mixture of ytterbium doped cesium iodide and barium iodide.

As depicted in FIG. 11B, the exemplary scintillator optic comprising cesium barium iodide doped with ytterbium exhibits fast, mid-slow (a.k.a. "medium") and slow decay components. Each decay component is respectively characterized by a decay time of about 74 (±2) nanoseconds for the fast component, corresponding to about 1.4% of the total light produced by the scintillator; about 870 (±70) nanoseconds for the mid-slow component, corresponding to approximately 30.9% of the total light produced by the scintillator; and about 2770 (±100) nanoseconds for the slow component, corresponding to the remaining approximately 57.7% of the light produced by the scintillator.

Illustrative Method

Figure 6:
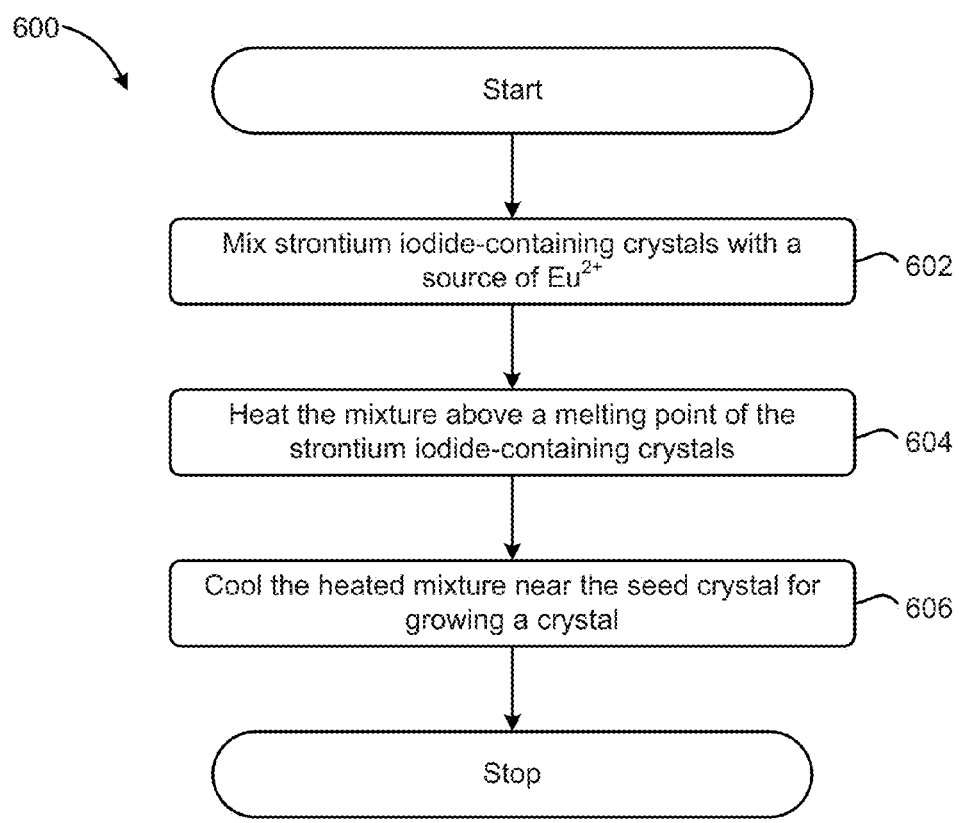
FIG. 6 is a flow chart of a method according to one embodiment.

Now referring to FIG. 6, a method 600 according to one embodiment is shown. As an option, the present method 600 may be implemented in the context and functionality architecture of the preceding descriptions. Of course, the method 600 may be carried out in any desired environment. It should also be noted that the aforementioned definitions may apply during the present description.

With continued reference to FIG. 6, in operation 602, strontium iodide-containing crystals are mixed with a source of $Eu^{2+}$. Any type of strontium iodide-containing crystals may be used, and the source of $Eu^{2+}$ may be of any type.

In operation 604, the mixture is heated above a melting point of the strontium iodide-containing crystals. The melting point may be different than that of $Eu^{2+}$ alone or It may be different than a melting point of strontium iodide-containing crystals alone.

In operation 606, the heated mixture is cooled near the seed crystal for growing a crystal. The grown crystal may contain more than 1.6% europium, more than 2.0% europium, or between about 0.5% and about 8.0% europium. Further, the europium in the grown crystal may be primarily $Eu^{2+}$.

Figure 12:
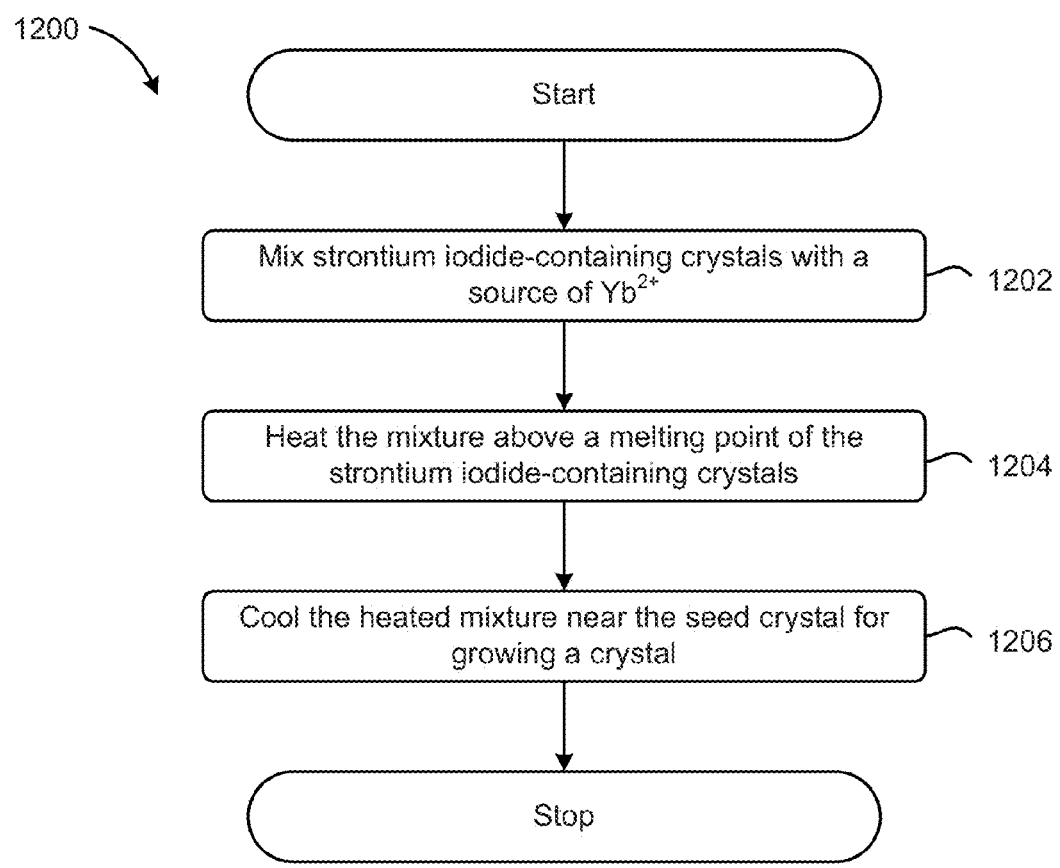
FIG. 12 depicts a flowchart of a method, according to one embodiment.

Now referring to FIG. 12, a method 1200 according to one embodiment is shown. As an option, the present method 1200 may be implemented in the context and functionality architecture of the preceding descriptions. Of course, the method 1200 may be carried out in any desired environment. It should also be noted that the aforementioned definitions may apply during the present description.

The method 1200 is described below primarily with respect to an embodiment including strontium iodide doped with ytterbium (II). However, those having ordinary skill in the art will appreciate that similar techniques using similar materials that a skilled artisan reading these descriptions would appreciate as suitable for use in a scintillation radiation detector also apply to, and are within the scope of, the present disclosures.

More particularly, it is to be appreciated that the presently disclosed techniques are also applicable to manufacturing scintillation radiation detector materials comprising metal halide(s) other than strontium iodide, such as strontium bromide, calcium bromide, calcium iodide, barium iodide, cesium iodide, cesium bromide, barium chloride, etc., and mixtures thereof, as would be understood by one having ordinary skill in the art upon reading the present descriptions.

Similarly, the presently disclosed techniques are also applicable to manufacturing scintillation radiation detector materials comprising salt(s) other than the above-disclosed metal halides. For example, in various approaches the scintillation radiation detector material may include one or more salts each comprising a metal cation and a monoelemental anion, such as metal carbonates, metalborates, metal sulfides, metal selenides, metal tellurides, metal oxides, metal phosphates, metal nitrides, etc. as would be understood by one having ordinary skill in the art upon reading the present descriptions.

With continued reference to FIG. 12, in operation 1202, strontium iodide-containing crystals are mixed with a source of $Yb^{2+}$. Any type of strontium iodide-containing crystals may be used, and the source of $Yb^{2+}$ may be of any type.

In operation 1204, the mixture is heated above a melting point of the strontium iodide-containing crystals. The melting point may be different than that of $Yb^{2+}$ alone, or may be different than a melting point of strontium iodide-containing crystals alone, in various approaches.

In operation 1206, the heated mixture is cooled near the seed crystal for growing a crystal. The grown crystal may contain more than 1.6% Ytterbium, more than 2.0% Ytterbium, between about 0.5% and about 10% Ytterbium, or more than 10% ytterbium, in various embodiments. Further, the Ytterbium in the grown crystal may preferably be primarily $Yb^{2+}$.

In further embodiments, the method may additionally and/or alternatively include incorporating europium and ytterbium, preferably in the form of $Eu^{2+}$ and $Yb^{2+}$, respectively, into the scintillation radiation detector material. In preferred approaches, the inclusion of both europium and ytterbium in combination advantageously reduces the frequency of light-trapping events characteristic of scintillation radiation detector materials including solely europium as an activator dopant.

Without wishing to be bound to any particular theory, the inventors propose that embodiments including a mixture of ytterbium and europium dopants in combination mitigate the occurrence and detrimental impact of light trapping in scintillation radiation detectors because when a photon is first absorbed by a ytterbium ion, the excited ytterbium tends to act on physically proximate europium ions via dipole interaction(s). These dipole interactions effectively transfer energy from the ytterbium ion to the europium ion, which subsequently emits the energy as radiation to provide the desired radiation detection capability on the scintillator material. Importantly, this method of dipole interaction energy transfer mitigates risk of a light-trapping event occurring, as is commonly the case when a europium ion directly absorbs a photon from a radiation source (rather than absorbing the energy via dipole interactions as with ytterbium).

Those having ordinary skill in the art will also appreciate that ytterbium is relatively unstable as a divalent ion, as compared to the trivalent ytterbium state (i.e. $Yb^{3+}$, ytterbium (III)). As a result, it is a common occurrence for manufacturing methods to incorporate ytterbium into the scintillator material in both these oxidation states, while it is preferred that the scintillator optics produced according to the present disclosures exclusively incorporate divalent ytterbium in lieu of including trivalent ytterbium. Without wishing to be bound to any particular theory, the inventors note that incorporation of trivalent ytterbium is believed to detriment performance of the resulting scintillator optic because the trivalent ytterbium ions do not exhibit the preferred scintillation behavior advantageous for application as a scintillation radiation detector, particularly a detector of ionizing radiation like gamma rays and/or neutron radiation.

In Use

Embodiments of the present invention may be used in a wide variety of applications, and potentially any application in which high light yield or high resolution is useful.

Illustrative uses of various embodiments of the present invention include, but are not limited to, applications requiring radiation detection. Search, surveillance and monitoring of radioactive materials are a few such examples. Various embodiments can also be used in the nuclear fuel cycle, homeland security applications, nuclear non-proliferation, medical imaging, etc.

Yet other uses include detectors for use in treaty inspections that can monitor the location of nuclear missile warheads in a nonintrusive manner. Further uses include implementation in detectors on buoys for customs agents at U.S. maritime ports, cargo interrogation systems, and instruments that emergency response personnel can use to detect or search for a clandestine nuclear device.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A single crystal, comprising:
at least one metal halide, wherein the at least one metal halide comprises beryllium iodide;
an activator dopant comprising ytterbium, wherein the ytterbium is divalent; and
at least one compound selected from a group consisting of: a selenide, and a telluride.

2. The crystal of claim 1, wherein the at least one metal halide further comprises an alkaline earth halide comprising a metal selected from a group consisting of strontium, barium and calcium.

3. The crystal of claim 2, comprising:
at least one additional activator dopant, wherein the additional activator dopant comprises europium primarily in the form of $Eu^{2+}$;
wherein the activator dopant is present in an amount ranging from about 0.5 mol % to about 10.0 mol % and the additional activator dopant is present in an amount less than an amount in which the activator dopant is present;
wherein the one or more metal halides comprise:
magnesium iodide;
calcium iodide;
strontium iodide;
barium iodide;
lithium iodide;
sodium iodide;
potassium iodide;
rubidium iodide; and
cesium iodide; and
wherein the crystal has a volume of at least one cubic centimeter; and
wherein the crystal has at least one face with an area of at least approximately one square centimeter.

4. The crystal of claim 1, wherein the crystal has a volume of at least one cubic centimeter.

5. The crystal of claim 1, wherein the crystal has at least one face with an area of at least approximately one square centimeter.

6. The crystal of claim 1, wherein the activator dopant is present in an amount ranging from about 0.5 mol % to about 10.0 mol %.

7. The crystal of claim 1, further comprising at least one additional metal halide, wherein the additional metal halide is selected from a group consisting of a strontium chloride, a barium chloride and a calcium chloride.

8. The crystal of claim 1, further comprising at least one additional activator dopant, wherein the additional activator dopant comprises europium primarily in the form of $Eu^{2+}$.

9. The crystal of claim 8, wherein the additional activator dopant is present in an amount less than an amount in which the activator dopant is present.

10. A scintillator optic, comprising:
at least one metal halide doped with a plurality of activators, the plurality of activators comprising a first activator and a second activator; and
at least one compound selected from a group consisting of: a selenide, and a telluride;

wherein the at least one metal halide comprises beryllium iodide and magnesium iodide;
wherein the first activator comprises divalent europium; and
wherein the second activator comprises divalent ytterbium.

11. A method for manufacturing a crystal suitable for use in a scintillator, the method comprising:
mixing one or more salts comprising beryllium iodide, magnesium iodide, and at least one of: a selenide and a telluride with a source of at least one dopant activator comprising divalent ytterbium;
heating the mixture above a melting point of the salts; and
cooling the heated mixture to a temperature below the melting point of the salts.

12. The method of claim 11, wherein the one or more salts further comprise:
at least one metal cation; and
at least one anion selected from a group consisting of: a borate, a carbonate, a nitrate, a phosphate, and a sulfide.

13. The method of claim 11, wherein the one or more salts further comprise at least one of:
calcium iodide;
strontium iodide;
barium iodide;
lithium iodide;
sodium iodide;
potassium iodide;
rubidium iodide; and
cesium iodide.

14. The method of claim 11, wherein the at least one dopant activator further comprises europium present in an amount less than the ytterbium, wherein each of the europium and the ytterbium are primarily divalent.

15. The method of claim 11, wherein the crystal is embodied as a single crystal having a volume of at least one cubic centimeter.

16. The method of claim 11, wherein the crystal is embodied as a single crystal having at least one face with an area of at least approximately one square centimeter.

17. The scintillator optic of claim 10,
wherein the second activator is present in an amount ranging from about 0.5 mol % to about 10.0 mol % and the first activator is present in an amount less than an amount in which the second activator is present;
wherein the at least one metal halide further comprises: rubidium iodide; and
wherein the optic comprises at least one single crystal formed from the at least one metal halide;
wherein the at least one single crystal has a volume of at least one cubic centimeter; and
wherein the at least one single crystal has at least one face with an area of at least approximately one square centimeter.

* * * * *